United States Patent [19]

Mitra et al.

[11] Patent Number: 5,221,867

[45] Date of Patent: Jun. 22, 1993

[54] PROGRAMMABLE LOGIC ARRAY WITH INTERNALLY GENERATED PRECHARGE AND EVALUATION TIMING

[75] Inventors: Sundari Mitra, Milpitas; Brad Heaney, Mountain View, both of Calif.

[73] Assignee: Intel Corporation, Santa Clara, Calif.

[21] Appl. No.: 775,724

[22] Filed: Oct. 11, 1991

[51] Int. Cl.⁵ .......................................... H03K 19/177
[52] U.S. Cl. .................................. 307/465; 307/443; 307/469; 307/481
[58] Field of Search ............... 307/443, 448, 452, 465, 307/468–469, 480–481

[56] References Cited

U.S. PATENT DOCUMENTS

| | | | |
|---|---|---|---|
| 4,611,133 | 9/1986 | Peterson et al. | 307/465 |
| 4,697,105 | 9/1987 | May | 307/469 X |
| 4,760,290 | 7/1988 | Martinez | 307/465 |
| 4,893,033 | 1/1990 | Itamo et al. | 367/465 |
| 4,914,633 | 4/1990 | Rose et al. | 365/203 |
| 4,990,801 | 2/1991 | Caesar et al. | 307/481 X |
| 5,003,501 | 3/1991 | Podkowa | 364/569 |
| 5,083,047 | 1/1992 | Horie et al. | 307/465 |
| 5,101,122 | 3/1992 | Shinonara | 307/443 X |
| 5,121,005 | 6/1992 | Parker | 307/465 |

Primary Examiner—David R. Hudspeth
Attorney, Agent, or Firm—Blakely, Sokoloff, Taylor & Zafman

[57] ABSTRACT

Timing signals governing the precharge and evaluation phases of a PLA are generated by internal circuitry so that the PLA can be maintained in a fully static mode without destroying data integrity and without dissipating a significant amount of power. "Dummy" lines connected at every programmable intersection are added to the PLA to provide a measure of the maximum propagation delay. The evaluation phase of the PLA is terminated closely following the maximum propagation delay and precharging is begun soon thereafter. The timing ensures that evaluation completes, valid data is latched and the PLA is returned to a precharge condition even if the phase clock signals are suspended and regardless of the states of the phase clock signals when suspended.

7 Claims, 4 Drawing Sheets

PROGRAMMABLE LOGIC ARRAY WITH INTERNALLY GENERATED PRECHARGE AND EVALUATION TIMING

FIELD OF THE INVENTION

This invention relates to the field of progammable logic arrays (PLAs), and particularly to a PLA that can be maintained in a static mode with very low power consumption.

BACKGROUND OF THE INVENTION

Programmable logic arrays (PLAs) are widely used, both as packaged devices and as elements of very large scale integrated (VLSI) circuits. A PLA generally comprises an input AND array or "plane" and an output OR array interconnected by a plurality of conductors, sometimes referred to as "minterms" Input signals are applied to the input lines which enable certain of the minterm lines in accordance with the manner in which the PLA has been "programmed". The minterms then enable certain of the bit lines of the output array, again in accordance with the PLA program.

PLAs typically operate in a cyclical fashion. Application of each input signal to the AND array is controlled by a gate circuit which is enabled by a timing signal. When the input gates are enabled, the input signals propagate through the PLA and the resulting output signals are held by output latches. The period of time during which the inputs are active and the outputs are latched is generally referred to as the evaluation phase. To speed the propagation of signals in the PLA, the minterm lines and output bit lines are usually precharged to a voltage level at or near the voltage corresponding to a logical high before the input gates are enabled. The evaluation and precharge phases of the PLA are typically governed by mutually exclusive clock signals such as illustrated in FIG. 1. In a microprocessor based system, the phase clock signals of the microprocessor are conveniently used to supply such mutually exclusive clock signals.

Externally supplied clock signals may not result in optimum performance of a PLA. Consequently, a number of approaches have been taken to generate PLA timing signals internally. For example, U.S. Pat. No. 4,893,033 issued to Itano et al. discloses a PLA having an internal pulse generation circuit for providing timing pulses. The pulse generation circuit is driven by a detection circuit that senses a change in levels of the PLA input signals. As another example, U.S. Pat. No. 4,914,633 issued to Rose et al. discloses a self-timed PLA in which internally generated timing of precharging and output data latching allows the input and minterm latches to be dispensed with. A delay circuit comprises a plurality of parallel-connected transistors, the number of transistors corresponding to the maximum number of transistors connected to a minterm conductor or output bit line. Such delay ensures that valid data are captured in the output latches.

An arrangement similar to that of Rose et al. is disclosed in U.S. Pat. No. 5,003,501 issued to Podkowa. Conventional precharge timing is used, but an internal timing circuit controls the output data latches. Dedicated PLA lines that make contact to every address line and every data transistor drive the timing circuit and ensure that valid data is latched independent of process variations affecting line capacitance.

None of the above-noted prior art PLA implementations is directed to providing a low power static mode, i.e., a PLA in which the timing signals may be suspended without loss of data or high power dissipation.

SUMMARY OF THE INVENTION

The present invention provides a PLA that can be maintained in a fully static mode without destroying data integrity and without dissipating a significant amount of power. Timing signals governing the precharge and evaluation phases of the PLA are generated by internal circuitry using conventional phase clock signals. "Dummy" lines connected at every programmable intersection are added to the PLA to provide a measure of the maximum propagation delay. The evaluation phase of the PLA is terminated closely following the maximum propagation delay and precharging is begun soon thereafter. The timing ensures that evaluation completes, valid data is latched and the PLA is returned to a precharge condition even if the phase clock signals are suspended and regardless of the states of the phase clock signals when suspended.

In a preferred embodiment, the invention is implemented by providing an additional word line in the AND plane and an additional bit line in the OR plane which together comprise means for measuring the maximum propagation delay through the PLA; by further providing a first circuit coupled to the delay measurement means and receiving one of the phase clock signals as an input for generating an evaluation control signal such that the evaluation phase begins substantially concurrently with a change of state of such phase clock signal and ends after the maximum propagation delay of the PLA; by also providing a second circuit coupled to the delay measurement means and receiving the other phase clock signal as an input for generating a precharge control signal such that the precharge phase begins after the evaluation phase ends and ends substantially concurrently with a change of state of the other phase clock signal.

DETAILED DESCRIPTION OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as not to obscure the description of the present invention with unnecessary detail.

Figure 1:
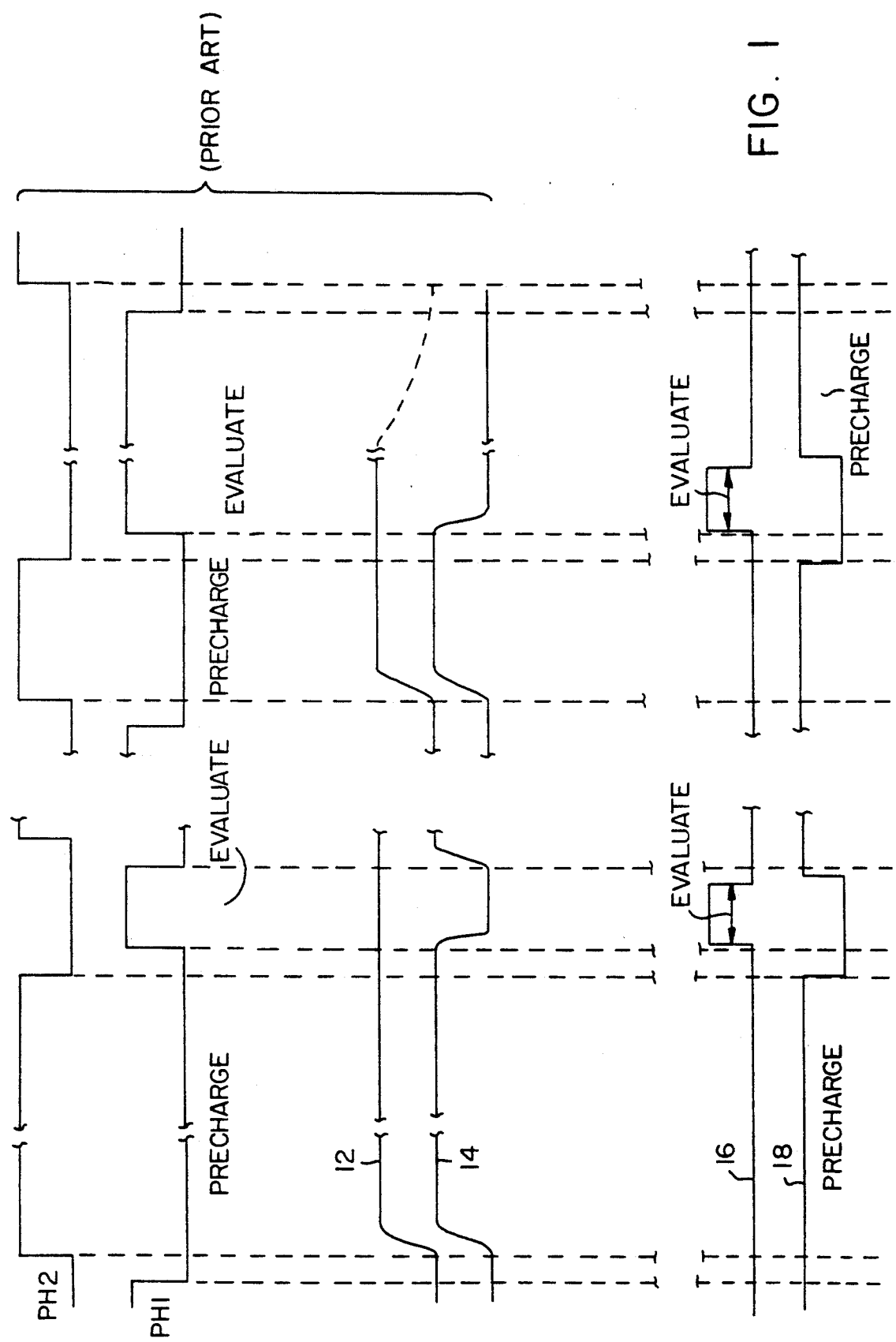
FIG. 1 is a timing diagram comparing operation of a prior art PLA with operation of a PLA according to the present invention.

FIG. 1 illustrates conventional timing for a prior art dynamic PLA. Timing of the PLA precharge and evaluate functions is governed by clock signals PH1 and PH2. The PLA precharges during PH2 and evaluates during PH1. FIG. 1 also shows the states of two AND plane bit lines 12 and 14. Bit line 12 is evaluated as a logical high signal, whereas bit line 14 is evaluated as a logical low signal.

In the left portion of FIG. 1, the clock is stopped during PH2, i.e., during the precharge phase. Bit lines 12 and 14, both having been precharged to a high level, remain at such level while the clock is stopped and evaluate in normal fashion during PH1 when the clock resumes.

The right portion of FIG. 1 illustrates the effects of stopping the clock during PH1, i.e., during the evaluate phase. Bit lines 12 and 14 precharge in normal fashion; however, during the extended evaluate phase, bit line 12 is unable to retain its state since there is no keeper to maintain charge on the line. Bit line 14 retains its low state since the output pull-ups are turned on during PH1; however, this means that power is being dissipated through the output pull-ups for as long as clock operation is suspended.

The lower portion of FIG. 1 illustrates a desired evaluate signal 16 and precharge signal 18 which overcome the problems associated with stopping the clock input to the prior art PLA device. During normal operation, the precharged signal corresponds functionally to PH2 and the evaluate signal corresponds functionally to PH1. If operation is suspended during the precharge phase, the precharge signal remains high and the evaluate signal remains low. This will maintain all bit lines in a precharged condition as in the prior art PLA. On the other hand, if operation is suspended during the evaluate phase, the evaluate signal 16 is driven low and the precharge signal 18 is driven high to return the PLA to the precharge condition and thereby avoid the undesirable effects noted above. In other words, the PLA of the present invention will always "idle" in the precharge condition.

Rather than waiting for the end of PH1, PLA evaluation is completed as rapidly as possible and the PLA is again precharged. This obviates the need to maintain the state of precharged bit lines. Furthermore, the time for which bit lines are forced low is reduced, thereby reducing overall power consumption.

Figure 2:
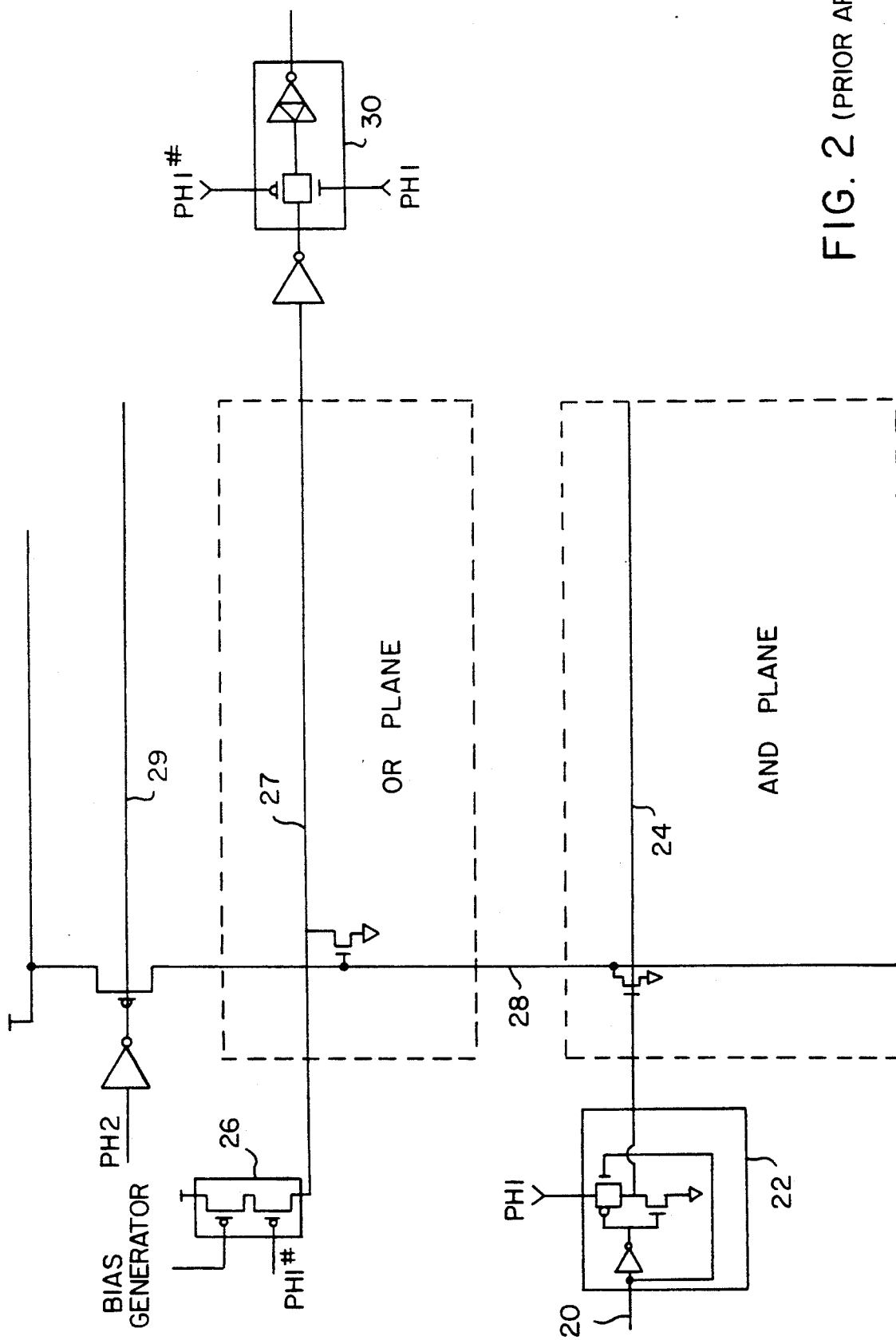
FIG. 2 schematically illustrates a prior art PLA circuit.

Referring now to FIG. 2, a conventional prior art PLA circuit is partially illustrated. Inputs, such as input 20, are stable before the rising edge of PH1. Input buffer 22 is designed so that the PH1 driver is used to drive all of the AND plane word lines, such as line 24 driven by buffer 22. During evaluation (PH1 high), bit lines in the AND plane that are not driven low must retain their charge. During this time, the output pull-ups, such as pull-up 26 coupled to OR plane bit line 27, supply current, and power is dissipated in the OR plane on all bit lines that are pulled low by connected minterms. During PH2, the minterm lines, such as line 28, are precharged high by precharge line 29 and the input and output latches are turned off.

Figure 3:
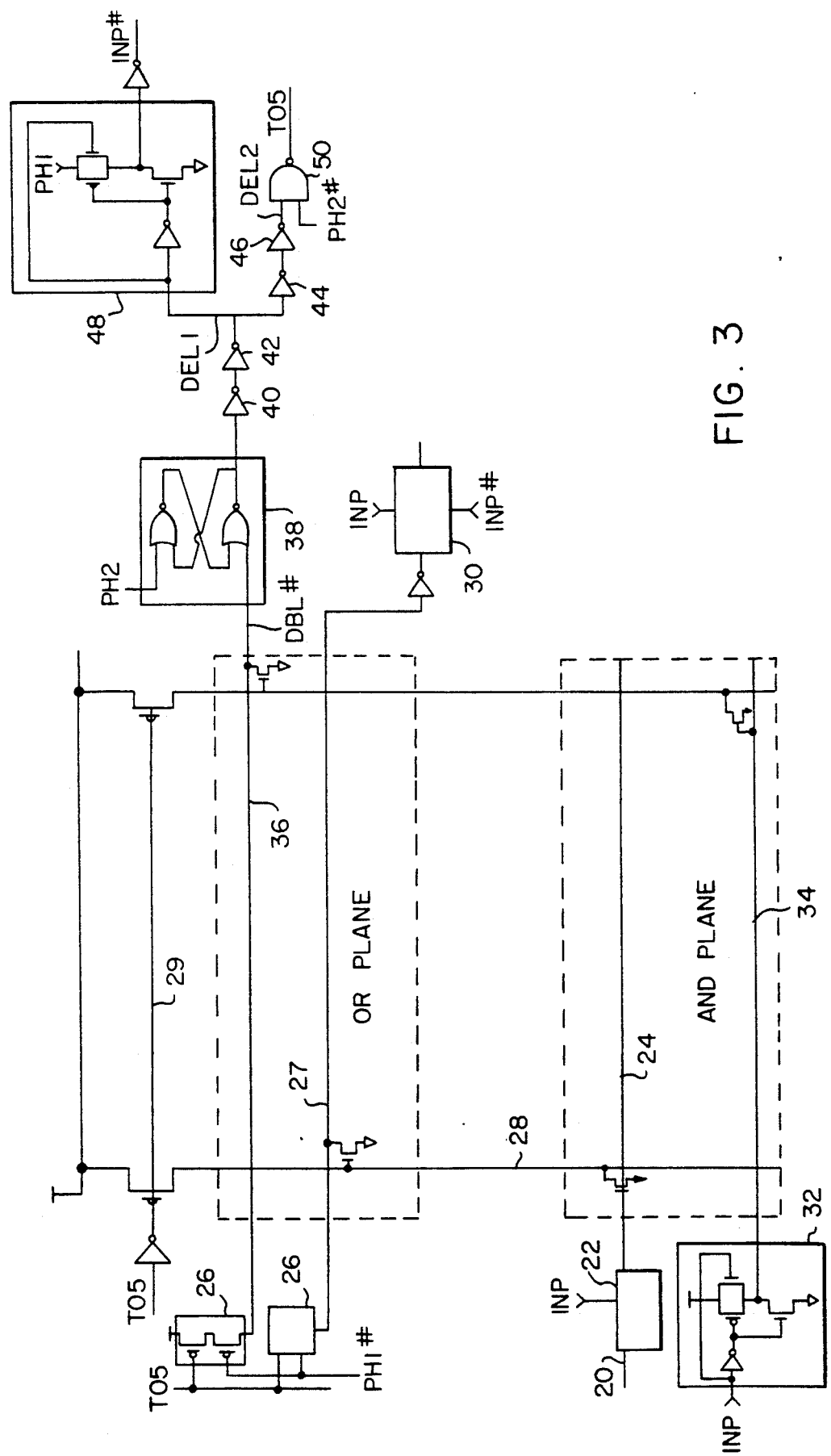
FIG. 3 schematically illustrates a PLA circuit according to the present invention.

FIG. 3 illustrates a PLA modified according to the present invention. It will be observed that the input buffers 22 are now driven by a new signal INP rather than clock signal PH1. Furthermore, the precharge line 29 is now driven by a new signal TOS rather than clock signal PH2. These new signals are generated, as will be described below, such that signal INP has the timing characteristics illustrated at line 16 in FIG. 1 and signal TOS has the timing characteristics illustrated at line 18 in FIG. 1.

A "dummy" input buffer 32 is provided to drive dummy word line 34. A dummy bit line 36 is added to the OR plane providing output DBL#. Word line 34 and bit line 36 are coupled to all of the minterms 28. For any PLA, the worst case delay path is through a combination of word lines and bit lines that have the maximum number of programming bits assigned. Therefore, since word line 34 and bit line 36 have all available programmable sites assigned, it is assured that output DBL# is the last to evaluate and establishes the maximum delay path through the PLA.

To account for the delay through output latches 30 and to provide additional timing margin, additional delay is added to output DBL#. Signal DBL# is asserted at RS flip-flop 38, the output of which is passed through a chain of weak inverters 40 and 42. The rise and fall times of these inverter outputs are not critical, and to get significant delays through inverters 40 and 42, long channel length transistors are preferably used. The output of inverter 42, DEL1, is applied to a further chain of weak inverters 44 and 46 to obtain further delayed signal DEL2.

As mentioned above, signal INP is used for controlling the duration of the evaluation period of the PLA. As illustrated in the FIG. 1, it is desired that signal INP go high with the rising edge of PH1 and go low after PLA evaluation is complete. Since PLA output DBL# has the maximum delay path through the PLA, signal DEL1 provides the desired signal that PLA evaluation is complete. Signal DEL1 is asserted at AND gate 48, together with clock signal PH1, to provide output signal INP.

A clock qualified AND gate 48 is used to generate signal INP rather than a more conventional AND gate configuration for two reasons. First, signal INP is used as the clocking signal for input buffer transfer gates 22 and therefore must drive all of the pull downs in the AND plane. If conventional logic gates are used to generate signal INP, large output drivers would be required. The configuration of gate 48 allows the PH1 driver to still be used for driving the AND plane. Second, it is important that signal INP have a rising edge that closely follows the rising edge of clock signal PH1 to avoid delaying the PLA outputs. With the design of gate 48, since signal DEL1 is high before clock signal PH1, there is no gate delay between the rising edge of PH1 and signal INP.

The design of gate 48 has two transfer gates in series at the input buffer stage. The additional series resistance of this design increases the rise time of signal INP. To overcome this disadvantage, an alternative design could qualify each input signal to the PLA with signal INP and drive the AND plane with clock signal PH1 directly as in the prior art design illustrated in FIG. 2. However, this alternative is not preferred since it involves substantially more hardware and layout design in comparison to the modifications shown in FIG. 3.

As illustrated in FIG. 1, precharge control signal 18 must turn off before the rising edge of evaluation control signal 16 (i.e., before the rising edge of signal INP) and must turn on after the falling edge of evaluation control signal INP. These two signals must be non-overlapping.

Referring again to FIG. 3, precharge control signal TOS is generated at the output of NAND gate 50 whose inputs are signal DEL2 and clock signal PH2#. Using clock signal PH2# ensures that precharging is turned off before the rising edge of PH1 and hence before the rising edge of signal INP. Since signal DEL2 is delayed from signal DEL1 by inverters 44 and 46, signal TOS cannot go high, and hence precharging cannot begin, until after signal INP goes low.

Signal TOS is also used to drive pull-ups 26 on the OR plane bit lines during evaluation. In the prior art design of FIG. 2, one section of pull-up 26 is connected to clock signal PH1# and the other is connected to a bias generator circuit. In the design of FIG. 3, signal TOS is used in place of the bias generator circuit, while the other section of pull-up 26 remains connected to signal PH1#. In this fashion, the falling edge of PH1# connects the OR plane bit lines to the supply voltage and signal TOS is used to disconnect the supply voltage. Thus, as desired, evaluation starts with the rising edge of PH1 and completes after all signals have propagated through the PLA.

RS latch 38 is added to output line DBL# to prevent a race condition if the clock signals are stopped with signal PH1 high. Without latch 38, stopping the clock in PH1 will cause signal DEL1 and DEL2 to toggle repeatedly, thereby causing the PLA to evaluate repeatedly. By adding latch 38, signals DEL1 and DEL2 are set in PH2 and are reset in PH1 by output signal DBL#. Both signals are inhibited from changing state more than once within a single clock phase. As shown in FIG. 3, latch 38 is safely implemented with NOR gates since both of the inputs to the latch can never be high at the same time.

Figure 4:
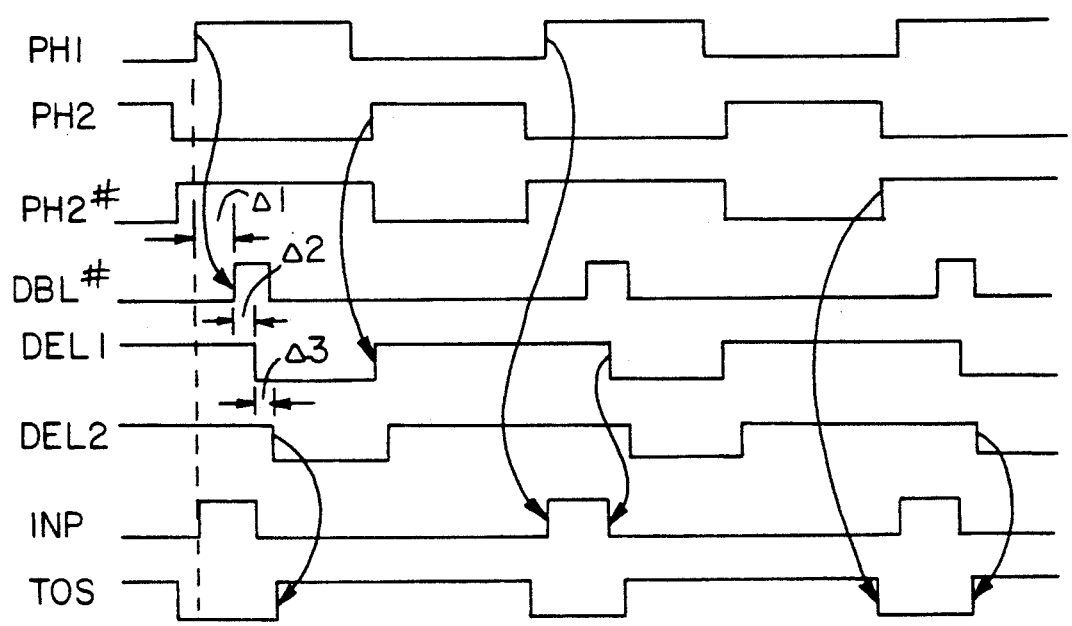
FIG. 4 is a detailed timing diagram of the circuit illustrated in FIG. 3.

FIG. 4 illustrates the timing relationships of the signals described above. The rising edge of clock signal PH1 begins the evaluation phase and output signal DBL# goes high following the PLA propagation delay Δ1. Signal DEL1 goes low following the rising edge of DBL# by gate delay Δ2. Signal DEL2 goes low after additional gate delay Δ3 causing signal TOS to go high. When clock signal PH2 goes high, signal DEL1 is driven high, followed by signal DEL2. The falling edge of signal DEL1 causes signal INP to go low, thereby ending the evaluation phase. The falling edge of PH2 (rising edge of PH2#) causes signal TOS to go low, thereby ending the precharge phase.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. An improved PLA of the type having an input array comprising a plurality of word lines, an output array comprising a plurality of bit lines, a plurality of minterm lines interconnecting the input and output arrays and having first and second timing signals for controlling an evaluation phase and a precharge phase respectively, wherein the improvement comprises:

delay measurement means for measuring a maximum propagation delay through the PLA:

first circuit means coupled to the delay measurement means and receiving the first timing signal as an input for generating an evaluation control signal such that the evaluation phase begins substantially concurrently with a change of state of the first timing signal and ends after the maximum propagation delay of the PLA, wherein the first circuit means comprises a latch circuit coupled to the delay measurement means, first delay means coupled to the latch circuit for adding a first incremental additional delay to the maximum propagation delay, and a first gate circuit coupled to the first delay means and to the first timing signal:

second circuit means coupled to the delay measurement means and receiving the second timing signal s an input for generating a precharge control signal such that the precharge phase begins after the evaluation phase ends and ends substantially concurrently with a change of state of the second timing signal.

2. The PLA of claim 1 wherein the delay measurement means comprises a dummy input line coupled to substantially all of the minterm lines and a dummy output line coupled to substantially all of the minterm lines.

3. The PLA of claim 1 wherein the second circuit means comprises second delay means coupled to the first delay means for adding a second incremental additional delay to the maximum propagation delay and a second gate circuit coupled to the second delay means and to the second timing signal.

4. The PLA of claim 3 wherein the first gate circuit comprises a clock qualified AND gate.

5. The PLA of claim 4 wherein the first gate circuit comprises an input buffer stage having two transfer gates in series.

6. The PLA of claim 3 wherein the first and second delay means comprise a plurality of gates constructed with long channel length transistors.

7. A method for controlling operation of a PLA of the type having an input array comprising a plurality of word lines, an output array comprising a plurality of bit lines, a plurality of minterm lines interconnecting the input and output arrays and having first and second timing signals for controlling an evaluation phase and a precharge phase respectively, comprising the steps of:

determining a maximum propagation delay through the PLA;

generating an evaluation control signal such that the evaluation phase begins substantially concurrently with a change of state of the first timing signal and ends after the maximum propagation delay of the PLA;

generating a precharge control signal such that the precharge phase begins after the evaluation phase ends and ends substantially concurrently with a change of state of the second timing signal;

whereby if the first and second timing signals are stopped, the PLA will remain in the precharge phase regardless of the respective states which the first and second timing signals have when stopped.

* * * * *

UNITED STATES PATENT AND TRADEMARK OFFICE
CERTIFICATE OF CORRECTION

PATENT NO. : 5,221,867
DATED : June 22, 1993
INVENTOR(S) : Sundari Mitra; Brad Heaney It is certified that error appears in the above-indentified patent and that said Letters Patent is hereby corrected as shown below:

Col. 6. line 14  Delete "s"  Insert --as--.

Signed and Sealed this

Twenty-second Day of March, 1994

Attest:

BRUCE LEHMAN

*Attesting Officer*   Commissioner of Patents and Trademarks